United States Patent [19]

Benton

[11] 4,186,315

[45] Jan. 29, 1980

[54] EXPANDED TIME CONSTANT CONDITION CONTROL SYSTEM USING A UNIDIRECTIONAL COUNTER WITH MULTIPLE CHANNELS

[75] Inventor: Ronald Benton, Minneapolis, Minn.

[73] Assignee: Honeywell Inc., Minneapolis, Minn.

[21] Appl. No.: 928,667

[22] Filed: Jul. 28, 1978

[51] Int. Cl.² .................. G05D 23/24; H05B 1/02; G05B 11/16
[52] U.S. Cl. ................................ 307/117; 328/72; 340/309.1; 236/1 C; 236/91 F
[58] Field of Search ............... 307/117, 38, 39, 41, 307/208, 220 R, 225 R, 265, 267, 132 ED, 132 T, 149, 155; 318/596, 603; 328/72, 73, 74; 340/309.1; 219/492, 494; 236/1 C, 46 F, 46 R, 91 R, 91 F; 165/14, 26

[56] References Cited

U.S. PATENT DOCUMENTS

| 3,443,121 | 5/1969 | Weisbrod | 236/46 F |
| 3,523,182 | 8/1970 | Phillips | 307/117 |
| 4,041,403 | 8/1977 | Chiapparoli | 307/220 R |

Primary Examiner—L. T. Hix
Assistant Examiner—S. D. Schreyer
Attorney, Agent, or Firm—Alfred N. Feldman

[57] ABSTRACT

A condition responsive time proportional control means which has a relatively fast time constant when operating in its proportional band has the time constant expanded by means of a digital counter. The counter is a resettable unidirectional type counter that has two counting channels. The main counting channel provides for the counting function during the normal cycling of the system when in the proportional band. A second channel in the counter acts to enable to the counter rapidly in the event that there is a disruption of the counter when the condition responsive system has been outside of the proportional band.

10 Claims, 5 Drawing Figures

EXPANDED TIME CONSTANT CONDITION CONTROL SYSTEM USING A UNIDIRECTIONAL COUNTER WITH MULTIPLE CHANNELS

CROSS-REFERENCE TO RELATED APPLICATIONS

The present application is an improvement on the pending application Ser. No. 872,867 in the name of Arlon D. Kompelien which was filed on Jan. 27, 1978 and is assigned to the assignee of the present invention.

BACKGROUND OF THE INVENTION

Time proportional control systems that are condition responsive are known. One of the major applications of this type of condition responsive control system is in the control of heating and cooling equipment. The present invention is generally applicable to any type of condition control system that utilizes a condition responsive time proportional control, but will be generally described in terms of a thermostatically controlled system or thermostat.

A thermostat typically uses thermal anticipation to obtain a better system performance. This anticipation reduces the dependence on the ambient space temperature to actuate the thermostat between its "on" and "off" conditions. Various means are used to obtain the anticipation heat, but all of these are thermal and are, therefore, subject to the different air flows that exist in different installations. If the actual air flow over the thermostat in a particular application is greater or less than the air flow the thermostat was designed for, the actual temperature rise of the sensor due to the anticipator will be reduced or enhanced. This will result in less than optimum performance. A similar effect will occur if the air flow changes from time to time in a given installation. If the air flow is constant, the anticipator can be readjusted to bring back optimum performance, but in changing air flow conditions no one setting will be optimum. It should also be noted that in most thermostats, a change in the characteristics of the anticipator will also change the entire system droop.

In an electronic thermostat, anticipation can be achieved electronically. This has the advantage of not being affected by air flow and thus eliminates all of the problems associated with thermal anticipation as noted above. One method of obtaining this type of anticipation is the use of a resistor and capacitor charge and discharge arrangement as part of the negative feedback of an electronic amplifier while using a fixed positive feedback. This type of electronic anticipation is injected as a negative feedback mode with a single order time constant. For proper system operation, this time constant may need to be in the order of sixteen minutes. To obtain this type of a time constant with a single resistor-capacitor arrangement requires high resistances and a very low leakage, large capacitor. The size of the resistors and capacitor would place a burden on the cost of the device, and on the physical size of the thermostat itself, making electronic anticipation obtained in this fashion impractical for many thermostatic applications.

To obtain the desired time constant of approximately sixteen minutes, a relatively small capacitor and reasonably sized resistors can be used thereby obtaining the relatively fast cycling rate in the time proportional control circuit. This relatively fast cycling rate can then be directly counted. If a counter is allowed to count up at a given rate during the "on" time of the anticipation, and another counter is allowed to count up at the same rate during the "off" time, we would have a digital representation of the "on" and "off" time periods for the desired operating condition (that is the actual deviation from the set point of the room temperature). The sum of these two counters is the cycling period. This type of information gives a complete description of the cycling pattern of the system for a constant input of a given magnitude. If the average room temperature and the set point remain constant, we could then let the cycling pattern continue but no longer allow the counters to count up. Each time the "on-off" action of the comparator or electronics occurs, the time counter would be reduced by a one count. When the counter reaches zero counts, the system will turn "off." The "off-on" action of the comparator or electronic amplifier would then start to count down the "off" time counter. When the "off" time counter reaches zero, the system would turn "on" and the counters would be allowed to count up at the given rate. This multiplies the "on" and "off" period by the number of counts stored in the counters. Since the basic "on" and "off" periods are determined by a constant, the concept also effectively multiplies by that same constant. To keep the system closer to the actual operating conditions, the "off" period counter can be updated each time the "on" period counter is counted down. Similarily, the "on" period counter can be updated each time the "off" period counter is counted down.

As thus described, the system will work well as long as the comparator is cycling. However, if a set point change is made or the deviation from the set point is such that the cycling stops, there is a possibility that the control can go out of "phase." That is, the furnace can be "on" when it should be "off," or the opposite can occur. Therefore, some means must be provided that will sense when these conditions occur and force the output into the proper state. One way would be to use two level detectors which could force the output into the proper state when the deviation from the set point is greater than the maximum anticipation signal or when the deviation is effectively negative. This method would involve a very critical calibration.

In the mentioned Kompelien application, a condition responsive time proportional control means has been specifically disclosed for a temperature responsive control means or a thermostat. The time proportional circuit utilizes a relatively small capacitor and resistors, and has a rapid cycling rate. This rapid cycling rate is sensed by a unidirectional counter that forms part of a counting means. The unidirectional counter, in one simple form, is a ripple counter. The cycling rate of the time proportional control means is combined with a pulse generating means so that the time constant of the overall control system can be multiplied by the pulse rate of the pulse generating means.

The Kompelien arrangement utilizes a readily available type of digital counter. The arrangement further has the advantage in that the system can never go out of synchronization with the state of the condition being responded to even if there is a sudden change in the condition or a sudden change in the set point of the condition responsive system. The capacitor of the cycler or the cycling rate of the condition responsive time proportional control means can be changed to tune the cycle rate of the control system for any particular application without changing the system droop.

SUMMARY OF THE INVENTION

In the previously mentioned prior art types of condition responsive time proportional control means, a problem has arisen in the application of the control system under certain operating conditions. It has been found that the prior art devices, due to their very long time constant (that is approximately sixteen minutes) can cause an undesirable cycling of the load.

Under load conditions of approximately ten to ninety percent of the system, the prior art devices work quite well. In the very light load conditions and the very heavy load conditions, the long time constant can disrupt the operation of the system when the device changes between the proportional band and outside of the proportional band. This disruption occurs in that a long time delay is required to load the counter when a change takes place and this long time interval in loading the counter can cause the overall system performance to be less than desirable.

The present invention recognizes that by providing the counting means with two separate counting channels, that it is possible to normally process the digital counting during the operation in the proportional band while maintaining the second counting channel inactive. After a given amount of time with a control temperature outside of the proportional band, the second counting channel is loaded in preparation to immediately change the state of the output means when the temperature reenters the proportional band. By using one counting channel to process the counts under most normal operating conditions the system can operate with excellent response. The second counting channel can either be reset when the first channel is operating normally, or can be used to store a series of counts in preparation for reestablishing the control function immediately upon a shift from outside of the proportional band to within the proportional band where the counting would be actively taking place.

The present invention discloses the concept in its general form and provides two specific examples of different implementations of digital logic which will perform the novel function.

BRIEF DESCRIPTION OF THE DRAWINGS

FIG. 5 is a block diagram of a second embodiment of the present invention.

DESCRIPTION OF THE PREFERRED EMBODIMENT

Figure 1:
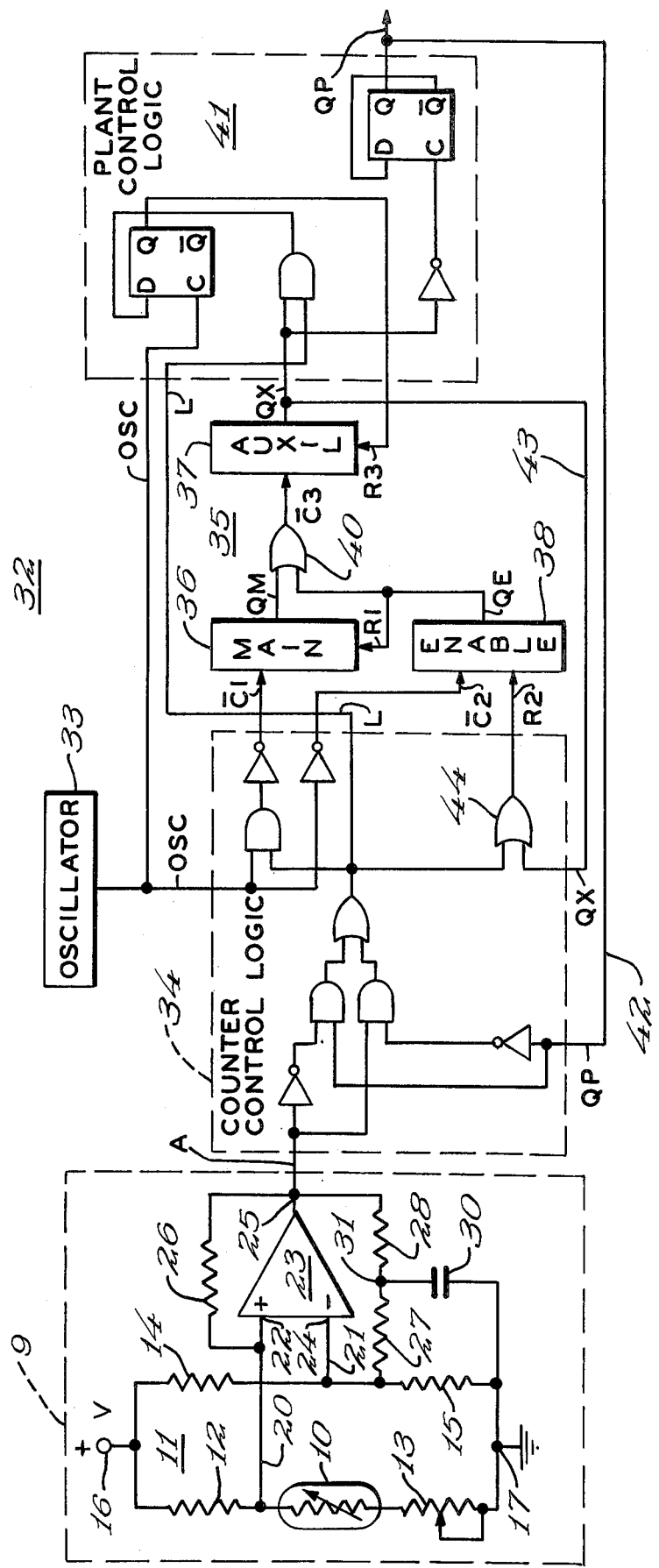
FIG. 1 is a schematic representation of an entire expanded time constant condition control system using a two channel counter.

A complete expanded time constant condition control system is disclosed in FIG. 1. While the present condition control system can respond to any type of condition responsive means, the description will be generally directed to a thermostat or temperature responsive type of condition control system. A condition responsive time proportional control means is disclosed at 9. A condition responsive element 10, disclosed as a temperature responsive resistor, is provided in a bridge circuit 11 that includes a further resistor 12 and a set point potentiometer 13 as one leg of the bridge. The second leg of the bridge includes a voltage divider made up of resistors 14 and 15. The bridge means 11 is energized from a potential generally connected at 16 with a common or ground 17. If the presently disclosed device were a thermostat and the temperature responsive resistor 10 was used, it would normally be a negative temperature coefficient resistor for sensing and controlling the ambient temperature while the set point potentiometer 13 would establish the point of control for the system.

The output of the bridge means 11 is on a pair of conductors 20 and 21 with the conductor 20 connected to the non-inverting terminal 22 of an operational amplifier 23 while the inverting terminal 24 is connected to the conductor 21. The operational amplifier 23 has an output at the junction 25. Between the junction 25 and the conductor 20, a positive feedback resistor 26 is provided to create a positive differential for the system. Between the junction 25 and the conductor 21, a further pair of resistors 27 and 28 are provided along with a capacitor 30 that is connected at a common point 31 between the resistors 27 and 28. The network of resistors and capacitor between the junction 25 and the inverting terminal 24 of the operational amplifier 23 provides a time proportional negative feedback which is responsible, along with the resistors 14 and 15, for a time constant in the control systems operation. In the present disclosure the time constant created by the resistors 14, 15, 27, 28 and the capacitor 30 is a relatively short time constant, and is the time constant which is expanded by the balance of the system. The charge and discharge of the capacitor 30 is regulated by the associated resistors, and the circuitry described to this point forms the condition responsive time proportional control means 9 which ultimately has a switched output at 25. This general type of condition responsive time proportional control means is in and of itself known, but its normal operating is with a time constant that is too short for use in an effective residential home temperature control system.

Figure 2:
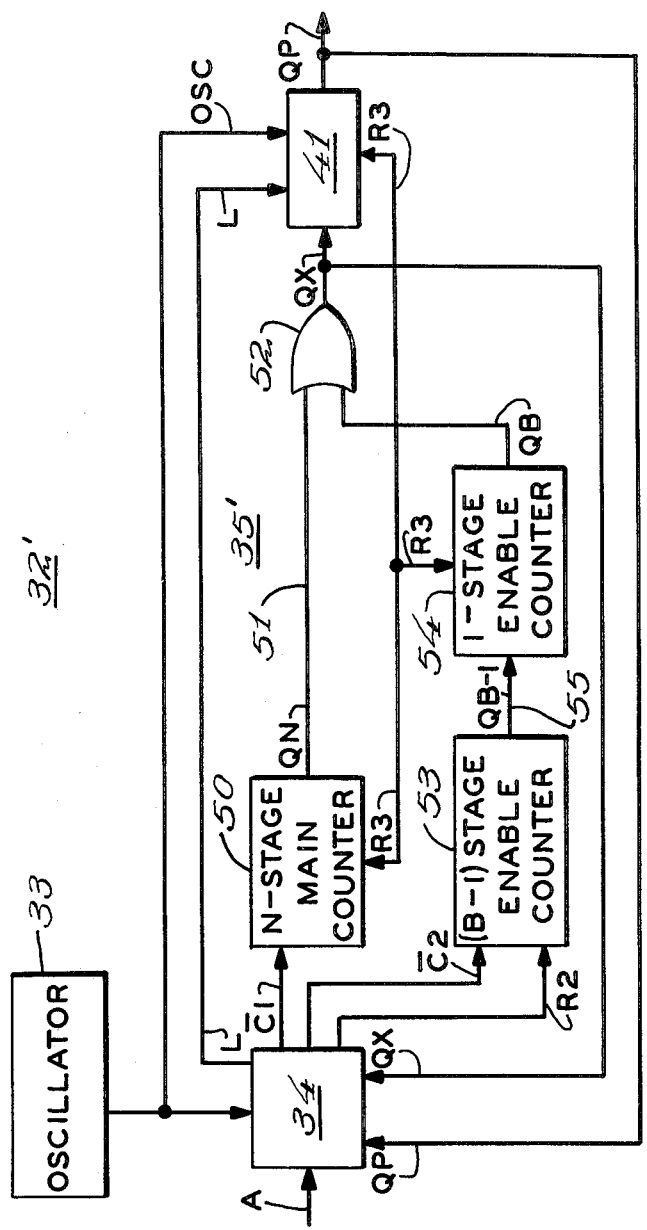
FIG. 2 is a truth table for one digital logic block contained in FIG. 1.

The switched output at 25 is connected by conductor A to a counting means generally disclosed as 32. The counting means 32 is made up generally of four parts. The first is a pulse generating means or oscillator 33 that continously supplies a series of pulses that is used to multiply the switched output at 25 and to control the digital logic of the counting means 32. The counting means 32 further includes a counter control logic block 34 which has as one of its inputs the switched output 25 on conductor A. The counter control logic 34 contains conventional NOT, AND, and OR digital elements and these elements will not be specifically described. The counter control logic 34 can be best understood by a reference to a truth table for the counter control logic 34 as is shown in FIG. 2. The counter control logic 34 has four inputs and four outputs thereby providing a truth table which contains eight separate states of operation. Since the truth table in FIG. 2 defines the function of the counter control logic 34 the specific internal elements have not been described in detail.

The counting means 32 has a further section generally disclosed as 35 which is made up of a plurality of unidirectional counters. The unidirectional counters in their simplest form are conventional ripple counters. The plurality of unidirectional counters includes a main counter 36, an auxiliary counter 37 and an enable counter 38. The main counter is connected by an OR gate 40 to the auxiliary counter 37 and this connection forms one counting channel for the invention. The enable counter 38 is connected through the same OR gate 40 to the auxiliary counter 37 to form a second or further counting channel for the counting means 32.

The fourth element that makes up the counting means 32 is a plant control logic element or block 41 that again contains conventional digital components. The plant control logic contains a conventional AND gate, NOR gate and a pair of C-D flip flops. The plant control logic 41 receives three inputs from other parts of the counting means 32 and provides output logic in the form of a reset R3 and an output means for the counting means 32 as shown at QP.

The various interconnections of the main four elements of the counting means 32 will now be described along with some of their basic functions. The counter control logic 34 in addition to having an input A receives an input OSC from the pulse generating means or oscillator 32. The counter control logic 34 further is connected by a conductor 42 to the output QP of the plant logic 41 and QP therefore becomes an input to the counter control logic 34. The last input to the counter control logic 34 is via a conductor 43 that connects the output QX of the auxiliary counter 37 to an OR gate 44 within the counter control logic 34. The inputs A, OSC, QP, and QX have been shown in the truth table in FIG. 4 as the four inputs for the counter control logic 34.

The counter control logic 34 in turn has four outputs. The first output is $\overline{C1}$ and acts as the clock input to the main counter 36. The counter control logic 34 has a second clock output $\overline{C2}$ that acts as an input to the enable counter 38. The OR gate 44 in the counter control logic 34 has an output R2 which is a reset connected to the enable counter 38 and which resets the enable counter to zero any time a reset pulse is provided at R2. The last output of the counter control logic 34 is via conductor L and which output is provided directly to the plant control logic 41.

As previously mentioned, the counting means 32 has a main counter 36 which receives a clock pulse $\overline{C1}$ as an input. The main counter 36 has an output QM that is fed to the OR gate 40 along with an output QE from the enable counter 38. The enable counter is clocked by the pulse $\overline{C2}$ and the reset function R2. The output of the enable counter 38 is connected to the OR gate 40 as well as forming an input reset R1 for the main counter 36. The output of the OR gate 40 forms a flow path for both of the counting channels previously mentioned and provides a clock pulse $\overline{C3}$ for the auxiliary counter 37 which has the output QX. The output QX is connected to the counter control logic 34 and acts as one input to the plant control logic 41. The auxiliary counter 37 is completed by receiving a reset R3 from the plant control logic 41.

The plant control logic 41 receives three inputs and has two outputs. The three inputs are OSC, L, and QX while the outputs are the reset R3 and the output for the plant QP. A truth table has not been provided for the plant control logic 41 as its function can be readily ascertained by considering its structure and also by reference to the two graphs provided in FIGS. 3 and 4.

Very briefly, the operation of FIG. 1 is as follows. The cycling of the thermostat or condition control system 9 provides a series of pulses on conductor A. The pulses on A are combined with the pulse generating means 33 which has been shown as OSC. Depending on the digital state of QX and QP, the counter control logic 34 will provide a series of counts to the main counter 36 which are multiplied by the pulse generating means 33 and are fed through the OR gate 40 to the auxiliary counter 37 which in turn operates the plant control logic 41. If the condition control system or thermostat 9 is in the middle of the proportional band, the counting will be normally processed through a first channel in the counting means 32 by loading the main counter 36 and then the auxiliary counter 37 which ultimately causes the plant control logic 41 to switch. The switching of the plant control logic in turn either turns "on" or "off" a load, such as a furnace. The digital logic has been selected so that the enable counter 38 is kept reset under these conditions. If the system is operating at, for example, five percent of its rated load, the reset pulses R2 are sufficiently infrequent so that the enable counter is loaded with counts directly from OSC from the $\overline{C2}$ clock input to the enable counter 38. The enable counter 38 is thus able to provide an output through the OR gate 40, and the auxiliary counter 37 is loaded in preparation to change the plant control logic 41 in a relatively short period of time as compared to loading the entire main counter 36.

If the condition control system has been outside of the proportional band and has not been cycling so that there is no digital counting occurring on conductor A, the enable counter 38 is loaded along with the auxiliary counter through the OR gate 40. The output of auxiliary counter 37 is a signal QX which is provided on conductor 43 to the OR gate 44 which resets the enable counter 38 in readiness for a resumption of output signals on conductor A. By using a dual channel counting means 32 and the counter control logic 34 combined with the plant control logic 41 a very rapid response can be obtained whenever the system is to function near the extremes of the proportional band without waiting for a long time interval in the main counter counting up the anticipation.

Before trying to describe the operation of the system disclosed in FIG. 1 in a more meaningful way, the truth table of FIG. 2 should be considered. It will be noted that four inputs A, QP, QX and OSC are shown. The outputs of the counter control logic 34 are $\overline{C1}$, $\overline{C2}$, L and R2. The truth table shows eight separate states of operation of the counter control logic that are possible. For example, in state 1, if A is zero, QP is zero, QX is zero, and the oscillator is operating, the outputs will be such that $\overline{C1}$ is zero, $\overline{C2}$ will have an inverted oscillator function, L will be zero and R2 will be zero. The various eight states can be applied to the operation of the system but the operation can best be understood by reference to the function versus time representations of FIGS. 3 and 4.

Figure 3:
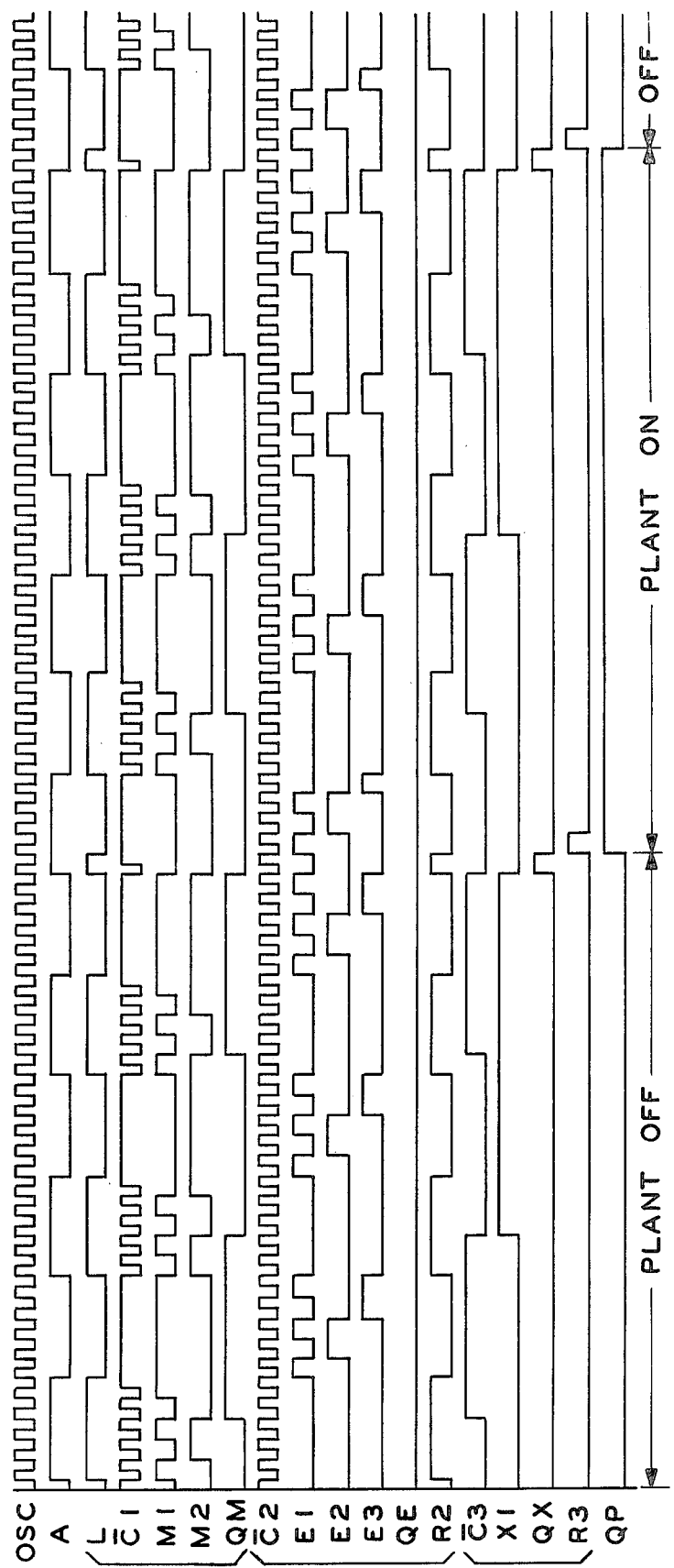
FIG. 3 is a function versus time representation of the system operating at fifty percent of full load.

In FIG. 3 a function versus time graph has been disclosed for the key input and output points in the counting means 32. The reference numerals used in FIG. 1 have been carried over to indicate the corresponding wave form or count that would exist in the device. Since the present system is a digital system, all of the portions of the function versus time graph of FIG. 3 can be considered either a one or a zero in digital logic, and are all referenced or related to the oscillator or pulse generating means 33 which is shown as the top graph. The second line is the cycling of the condition control system as shown on conductor A. In this particular figure the load is considered to be a fifty percent load, and it will be noted that the digital "on" and "off" times at A are equal. The next line of the graph is the output L which is a function that can be determined by reference to the truth table in FIG. 2.

The next four functions shown, $\overline{C1}$, M1, M2 and QM are the digital inputs and outputs of the main counter 36. The $\overline{C1}$ function is the clock pulse into the main counter 36, M1 is the first stage of the main counter, M2 is the second stage of the main counter, and QM is the output of the main counter. It will be noted that this is the standard ripple type of counting mechanism.

The next representation in the graph is six functions that relate to the enable counter 38. The $\overline{C2}$ function, which is the input or clock to the enable counter 38 is an inversion of OSC. Stages E1, E2 and E3 are three internal stages of the enable counter 38 while QE is the output of the enable counter. The enable counter 38 also is supplied with a reset signal shown as R2. It will be noted that due to the counting mechanism and the reset arrangement, that the enable counter 38 has a constant output of 0 at QE when the system is operating at the fifty percent load as disclosed in FIG. 3.

The next representation is of the function of the auxiliary counter 37. The auxiliary counter 37 has a clock input $\overline{C3}$, a first counting stage X1 and an output QX. The auxiliary counter 37 also has a reset R3. The last representation is of QP the output of the plant control logic 41 which is the switching function of either a 1 or a 0 to turn "on" or "off" a load, such as a furnace.

In considering the fifty percent load example, exemplified in FIG. 3, each of the digital logic representations can be worked out by consideration of the truth table in FIG. 2 and the logic of the plant control logic element. It will be noted that as long as a cycling is supplied at A in the fifty percent area, that the main counter 36 receives a series of pulses and counts up regularly at a fifty percent rate so that its output QM represents an expanded fifty percent output. The enable counter at QE has no output as the counter has been reset by R2 more regularly than the counter is capable of generating an output. Since the output QE is zero, the OR gate 40 merely allows the count in the main counter 36 on conductor QM to be fed to the auxiliary counter 37. The auxiliary counter receives its input from the OR gate 40 as the clock input $\overline{C3}$ which corresponds to the output QM of the main counter 36. The auxiliary counter then counts up through its stages and provides an output QX. The output QX is fed into the plant control logic 41 where the C-D flip flops are activated and a reset pulse R3 is provided. The count progresses until QP changes, in the example from an "off" state to an "on" state. This "on" and "off" cycling will continue at the output QP as long as the device stays in this range. Any shift of the percent load between approximately ten percent and ninety percent will operate the system with the enable counter 38 kept in a reset mode. The exact limits for the operating range can be selected depending on the digital logic and the needs of the system.

Figure 4:
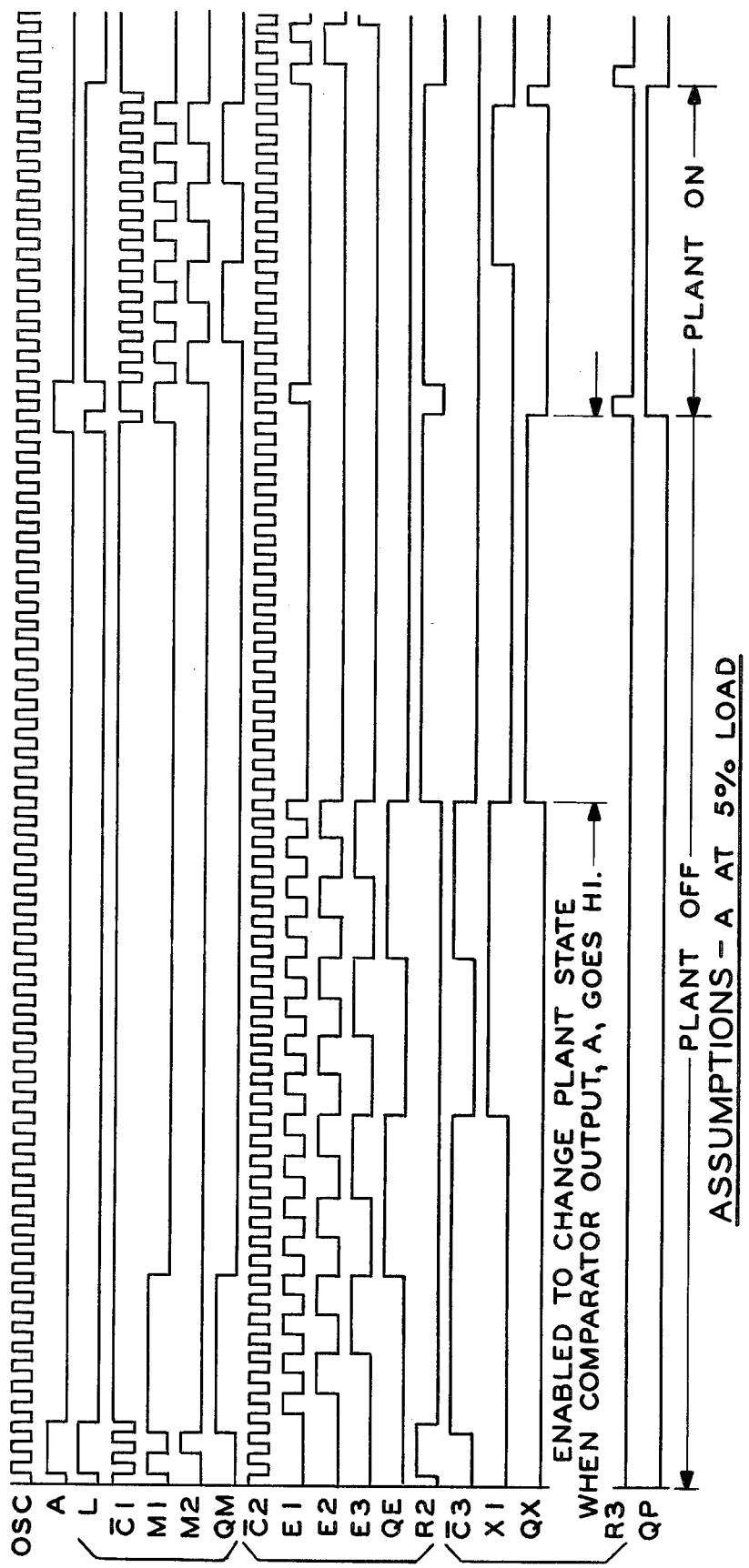
FIG. 4 is a function versus time graph of the system operating at about five percent of full load.

In FIG. 4 there is disclosed a function versus time disclosure for a representation at five percent of load. All of the represented curves are of the same functions as in FIG. 3 and, therefore, will not be specifically identified. The overall operation of the device disclosed as operating at five percent load shows that the digital switching on conductor A is "on" approximately five percent of the time, and is "off" ninety-five percent of the time. The output on conductor L substantially follows the digital switching on A and the main counter 36 combines the short period of "on" time or 1's on conductor L with a small number of clock pulses $\overline{C1}$ thereby providing QM with a switched output representative of this combination.

The enable counter 38 has the capability of counting up a sufficient number of counts to switch so that in the example disclosed in FIG. 4 the enable counter has an output at QE which switches from 0 to 1 and back again a number of times thereby providing an input through the OR gate 40 to the auxiliary counter 37 that is different than when the enable counter 38 was kept reset in FIG. 3.

The auxiliary counter is now receiving information from both the main counter 36 and from the enable counter 38, and the wave form disclosed for $\overline{C3}$, X1, and QX reflects that the system is activated at a much earlier time in that QX switches in response to what is occurring in the enable counter. The combination of the change in the switching of the enable counter 38 and the auxiliary counter 37 now provides for a response by the plant control logic 41 as a function of the second counting channel to thereby provide an output at QP to be switched from the "off" condition to the "on" condition at a different time that if a single chain of counters as has been used. With this arrangement the enable counter 38 causes the counting means 32 to react without the entire delay of the anticipation cycle when it is necessary or desirable to cause the output QP to switch to either turn the plant "on" or "off" depending on whether the load is at a high extreme or a low extreme. Examples of other percent loads can be developed using the information contained in the truth table and the diagram of FIG. 1, but it is believed that anyone skilled in this particular art can readily develop the function versus time for any desired percent load or operating level.

In FIG. 5 a second embodiment of the invention is disclosed. The embodiment disclosed in FIG. 5 utilizes the same notations as in FIG. 1 as far as possible. A counting means 32' is disclosed once again using an oscillator 33 that forms the pulse generating means for the counting means 32'. The counter control logic is shown in block 34 with the conductor A as an input, as was the case in FIG. 1. The counter control logic 34 provides a clock output $\overline{C1}$, a second clock output $\overline{C2}$ and a reset pulse R2. The counter control logic 34 receives the plant output means signal QP and a counting channel output means QX. The truth table of FIG. 2 and the schematic disclosed in FIG. 1 are applicable to the counter control logic 34 disclosed in FIG. 5.

In the embodiment of FIG. 5 the plurality of unidirectional counters 35' is disclosed made up of a main counter 50 with N stages. The main counter has an output QN on a conductor 51 that is provided to an OR gate 52 which provides the output QX in this particular configuration. A pair of enable counters 53 and 54 are provided in this embodiment. The enable counter 53 is made up of B-1 stages and has an output QB-1 on conductor 55 to the second enable counter 54 which is a single stage enable counter which has the output QB. The clock pulse $\overline{C2}$ is one of the inputs to the enable counter 53 and the enable counter 53 is further the recipient of the reset R2. The plant control logic 41 is again provided and has as one of its inputs QX along with the inputs L and OSC. The plant control logic 41 has an output R3 as a reset and the output means QP to the plant or furnace. In this particular case the reset R3 is fed both to the main counter 50 and to the single stage enable counter 54.

The arrangement disclosed will provide the same basic function as FIG. 1 but accomplishes it by using a single ripple counter in the main counting channel and uses a two stage enable counter to provide the function of partially loading the enable counter and then allowing it to immediately take over the switching of the plant control logic 41 when the cycling on conductor L restarts after the signal has been out of the proportional range, or has been either 1 or 0 for some substantial period of time. The function versus time graphs for FIG. 5 have not been developed, but can be readily developed using the truth table of FIG. 2 and the logic disclosed in FIG. 1 for the counter control logic 34 and the plant control logic 41.

The present invention is broadly directed to the concept of having a counting mechanism that is capable of a very short response when the overall system is near either of its extreme load conditions. This is accomplished by having two counting channels. One counting channel processes the counts in a normal fashion as the prior art disclosure when the system is cycling in the proportional band. The second counting channel takes over to accelerate the counting function whenever the system is at one of the extremes. The design of the particular type of counting mechanism can be implemented by many different types of digital logic. Two different embodiments have been disclosed to show the flexibility of the design of the digital logic to accomplish the novel concept. Since the novel concept can be implemented by any number of different digital configurations, the applicant wishes to be limited in the scope of his invention solely by the scope of the appended claims.

The embodiments of the invention in which an exclusive property or right is claimed are defined as follows:

1. An expanded time constant condition control system, including: condition responsive time proportional control means having switched output means; said switched output means providing repetitively switched output signals at a rate representative of a time constant of said time proportional control means when said condition responsive means senses a condition which is within a selected range; said switched output means providing constant output signals when said condition is outside of said selected range; counting means including a plurality of unidirectional counters with said counting means having input means responsive to said switched output signals; said counting means further including pulses generating means; said pulse generating means having output means connected to said counting means and providing signals thereto; said plurality of unidirectional counters including two counting channels; a first counting channel normally processing signals from said time proportional control means output means and said pulse generating means; a second counting channel being held in a state of readiness when said first counting channel is normally processing signals from said output means; said second counting channel enabled to provide an override function for said counting means when said normal processing of signals has been disrupted for a preselected period of time; and said counting means combining said condition responsive repetitively switched output signals and said pulse generating output signals to expand said time constant of said condition responsive time proportional control means at an output means of said counting means.

2. An expanded time constant condition control system as described in claim 1 wherein said counting means includes counting control logic means connected to said switch output as one input; and said counter control logic means acting to control said two counting channels.

3. An expanded time constant condition control system as described in claim 2 wherein said counting means further includes plant control logic as an output of said counting means with said plant control logic supplying digital logic to said counting control logic means to control said two counting channels; plant control logic further adapted to control said condition control system.

4. An expanded time constant condition control system as described in claim 3 wherein said unidirectional counters are ripple counters.

5. An expanded time constant condition control system as described in claim 4 wherein said first counting channel includes a main counter and an auxiliary counter with said main counter connected as an input for said auxiliary counter.

6. An expanded time constant condition control system as described in claim 5 wherein said second counting channel includes an enable counter connected an an input for said auxiliary counter.

7. An expanded time constant condition control system as described in claim 6 wherein said condition being controlled is temperature and said condition responsive time proportional control means has bridge means with at least one leg of said bridge means including a temperature responsive variable resistance.

8. An expanded time constant condition control system as described in claim 4 wherein said first counting channel is a main counter connected as an input to said plant control logic.

9. An expanded time constant condition control system as described in claim 8 wherein said second counting channel includes two enable counters connected in series as a further input to said plant control logic; said enable counters being connected and arranged to provide said override function for said counting means when said main counter has been disrupted.

10. An expanded time constant condition control system as described in claim 9 wherein said condition being controlled is temperature and said condition responsive time proportional control means has bridge means with at least one leg of said bridge means including a temperature responsive variable resistance.

* * * * *

UNITED STATES PATENT OFFICE
CERTIFICATE OF CORRECTION

PATENT NO. : 4,186,315
DATED : January 29, 1980
INVENTOR(S) : RONALD BENTON

It is certified that error appears in the above-identified patent and that said Letters Patent are hereby corrected as shown below:

Claim 1, line 49, cancel "pulses" and substitute -pulse-.

Claim 6, line 33, cancel "an" (first usage) and substitute -as-.

Signed and Sealed this

Twentieth Day of May 1980

[SEAL]

Attest:

SIDNEY A. DIAMOND

Attesting Officer

Commissioner of Patents and Trademarks